United States Patent
Sugiura et al.

(10) Patent No.: US 10,355,675 B2
(45) Date of Patent: Jul. 16, 2019

(54) INPUT CIRCUIT

(71) Applicant: SII Semiconductor Corporation, Chiba-shi, Chiba (JP)

(72) Inventors: Masakazu Sugiura, Chiba (JP); Tsutomu Tomioka, Chiba (JP)

(73) Assignee: ABLIC INC., Chiba (JP)

( * ) Notice: Subject to any disclaimer, the term of this patent is extended or adjusted under 35 U.S.C. 154(b) by 163 days.

(21) Appl. No.: 15/266,525

(22) Filed: Sep. 15, 2016

(65) Prior Publication Data
US 2017/0093378 A1     Mar. 30, 2017

(30) Foreign Application Priority Data
Sep. 24, 2015   (JP) ................. 2015-187339

(51) Int. Cl.
*H03K 3/3565*     (2006.01)

(52) U.S. Cl.
CPC ................. *H03K 3/3565* (2013.01)

(58) Field of Classification Search
USPC ................................ 327/108–112
See application file for complete search history.

(56) References Cited

U.S. PATENT DOCUMENTS

| | | | |
|---|---|---|---|
| 4,551,691 A | 11/1985 | Ogawa | |
| 4,786,825 A * | 11/1988 | O'Shaughnessy | H03K 3/3565 327/206 |
| 5,489,866 A * | 2/1996 | Diba | H03K 3/012 327/205 |
| 5,671,186 A * | 9/1997 | Igura | G11C 7/12 365/185.25 |
| 6,038,194 A * | 3/2000 | Davies | G11C 7/067 365/185.21 |
| 6,118,318 A * | 9/2000 | Fifield | H03K 3/3525 326/27 |
| 6,172,529 B1 * | 1/2001 | Klim | H03K 19/0963 326/121 |
| 6,281,730 B1 * | 8/2001 | Vu | H03K 19/00384 323/316 |

(Continued)

FOREIGN PATENT DOCUMENTS

| | | |
|---|---|---|
| JP | S59-61215 A | 4/1984 |
| JP | 09-270678 A | 10/1997 |

(Continued)

OTHER PUBLICATIONS

Office Action in Japan Application No. 2015-187339, dated Apr. 2, 2019, including English Translation, 6 pages.

*Primary Examiner* — Adam D Houston
(74) *Attorney, Agent, or Firm* — Brinks Gilson & Lione

(57) ABSTRACT

To provide an input circuit which avoids power supply voltage dependency of a threshold of the input circuit when an output signal is transited. There is provided an input circuit equipped with an input transistor and a current source connected in series between a first power supply and a second power supply. The input circuit is configured in such a manner that an input signal is inputted to a gate of the input transistor and a signal of a connection point between the input transistor and the current source is outputted as an output signal, and a current value of the current source is changed based on the output signal.

4 Claims, 5 Drawing Sheets

(56) References Cited

U.S. PATENT DOCUMENTS

| | | | | |
|---|---|---|---|---|
| 6,281,731 B1* | 8/2001 | Fifield | ............... | H03K 3/02337 327/205 |
| 6,388,488 B1* | 5/2002 | Ho | ............... | H03K 3/356008 327/112 |
| 6,664,813 B2* | 12/2003 | McCurdy | ......... | H03K 19/01721 326/119 |
| 6,765,374 B1* | 7/2004 | Yang | ............... | G05F 1/575 323/280 |
| 6,777,987 B2* | 8/2004 | Chae | ............... | H03K 5/12 326/86 |
| 6,861,827 B1* | 3/2005 | Yang | ............... | G05F 3/262 323/273 |
| 7,495,506 B1* | 2/2009 | Carper | ............... | G05F 1/575 327/534 |
| 8,248,176 B2 | 8/2012 | Takano et al. | | |
| 8,593,178 B2 | 11/2013 | Abe et al. | | |
| 9,276,565 B2* | 3/2016 | Tomita | ............... | H03K 3/017 |
| 9,712,158 B1* | 7/2017 | Cavus | ............... | H03K 17/687 |
| 9,766,274 B2* | 9/2017 | Song | ............... | G01R 19/0092 |
| 9,853,533 B2* | 12/2017 | Sambucco | ............... | G05F 1/46 |
| 2004/0140845 A1* | 7/2004 | Eberlein | ............... | G05F 1/575 327/541 |
| 2004/0155689 A1* | 8/2004 | Kumar | ............... | H03K 3/3565 327/205 |
| 2005/0231233 A1 | 10/2005 | Kasai et al. | | |
| 2007/0194928 A1* | 8/2007 | Berhorst | ............... | G06K 19/0701 340/572.5 |
| 2009/0039869 A1* | 2/2009 | Williams | ............... | H01L 23/49575 324/123 R |
| 2009/0051427 A1* | 2/2009 | Miyashita | ............... | H03F 1/52 330/251 |
| 2010/0295476 A1* | 11/2010 | Franco | ............... | G05F 1/561 315/297 |
| 2012/0176112 A1* | 7/2012 | Singh | ............... | G05F 1/573 323/284 |
| 2014/0320095 A1* | 10/2014 | Sambucco | ............... | G05F 1/46 323/271 |
| 2015/0061611 A1* | 3/2015 | Li | ............... | H02M 3/1588 323/235 |
| 2016/0065072 A1* | 3/2016 | Xiu | ............... | H02M 1/08 323/271 |
| 2016/0134274 A1* | 5/2016 | Takemura | ............... | G01R 31/00 327/143 |
| 2017/0302268 A1* | 10/2017 | Takemura | ............... | G01R 31/00 |
| 2018/0006643 A1* | 1/2018 | Schulmeyer | ............... | H03K 17/0822 |

FOREIGN PATENT DOCUMENTS

| | | |
|---|---|---|
| JP | 2005-303859 A | 10/2005 |
| JP | 2011-150675 A | 8/2011 |
| JP | 2013-42362 A | 2/2013 |

\* cited by examiner

INPUT CIRCUIT

RELATED APPLICATIONS

This application claims priority under 35 U.S.C. § 119 to Japanese Patent Application No. 2015-187339 filed on Sep. 24, 2015, the entire content of which is hereby incorporated by reference.

BACKGROUND OF THE INVENTION

Field of the Invention

The present invention relates to an input circuit having hysteresis characteristics in a threshold detecting an input signal.

Background Art

FIG. 5 is a circuit diagram illustrating one example of a related art input circuit having hysteresis characteristics. The related art input circuit 500 is equipped with an N type transistor 501, P type transistors 502 and 503, and an inverter 504.

The transistor 501 and the transistor 502 respectively have drains connected to each other and gates connected in common, and are inputted with an input signal IN at the gates thereof. The drains of the transistor 501 and the transistor 502 are respectively connected to the input of the inverter 504 and a drain of the transistor 503. The output of the inverter 504 becomes an output signal OUT of the input circuit 500. Further, the output signal OUT is inputted to a gate of the transistor 503.

The input circuit 500 is operated at a positive power supply voltage (VDD) and a negative power supply voltage (VSS).

Since the transistor 502 is turned ON and the transistor 501 is turned OFF when the input signal IN is at an L level, the drains of the transistor 501 and the transistor 502 respectively become H in level. Accordingly, the output signal OUT of the inverter 504 becomes L in level and the gate of the transistor 503 becomes L in level. Thus, since the gate-source of the transistor 503 is ON-controlled by the magnitude of VDD, the transistor 503 indicates an ON state. When the input signal IN is increased from the L level, the output signal OUT of the inverter 504 is transited from the L to H level, based on a magnitude relationship between a current driving force of the transistor 501 and net current driving forces of the transistors 502 and 503 which are indicative of the ON state. The threshold of the input circuit 500 at the time that the output signal OUT is transited from the L to H level is determined in the way described above.

Since the transistor 501 is turned ON and the transistor 502 is turned OFF when the input signal IN is at an H level, the drains of the transistors 501 and 502 respectively become L in level. Accordingly, the output signal OUT of the inverter 504 becomes H in level and the gate of the transistor 503 becomes L in level. Thus, since the gate-source of the transistor 503 is OFF-controlled, the transistor 503 indicates an OFF state. When the input signal IN is lowered from the H level, the output signal OUT of the inverter 504 is transited from the H to L level, based on a magnitude relationship between the current driving force of the transistor 501 and the current driving force of the transistor 502. The threshold of the input circuit 500 at the time that the output signal OUT is transited from the H to L level is determined in the way described above.

With the current driving force of the transistor 503 ON-controlled by the magnitude of VDD, the threshold of the input circuit 500 at the time that the output signal OUT is transited from the L level to the H level is higher than the threshold of the input circuit 500 at the time that the output signal OUT is transited from the H level to the L level. In the related art input circuit 500, the hysteresis characteristics are obtained in this way. With the hysteresis characteristics, an unstable operation of a post-stage circuit for the input circuit due to chattering related to the intrusion of external noise is avoided (refer to, for example, Patent Document 1).

[Patent Document 1] Japanese Patent Application Laid-Open No. Hei 9 (1997)-270678

SUMMARY OF THE INVENTION

The related art input circuit 500 is however accompanied by a problem that since the transistor 503 is ON-controlled by the magnitude of VDD, the threshold of the input circuit 500 at the time that the output signal OUT is transited has power supply voltage dependency.

That is, it is not possible to cope with a case in which the input signal IN is supplied by a microcomputer operated at a low voltage. A problem can possibly occur in that since the power supply voltage of the input circuit 500 is high, the microcomputer recognizes the input signal IN as the L level regardless of the signal of H level being supplied to the input circuit 500 as the input signal IN. Solving this problem is essential while the operating voltage of the microcomputer is being reduced nowadays.

Therefore, an object of the present invention is to solve the above-described problems and provide an input circuit having hysteresis characteristics, which avoids power supply voltage dependency of a threshold when an output signal is transited.

In order to solve the above-described problems, there is provided an input circuit according to the present invention, which is equipped with an input transistor and a current source connected in series between a first power supply and a second power supply. An input signal is inputted to a gate of the input transistor. A signal of a connection point between the input transistor and the current source is outputted as an output signal. A current value of the current source is changed based on the output signal.

According to the input circuit of the present invention, since the threshold of the input circuit is determined by a current value of a current source, it is not positively affected by a power supply voltage. It is therefore possible to avoid power supply voltage dependency of the threshold of the input circuit at the time that an output signal is transited.

DETAILED DESCRIPTION OF THE PREFERRED EMBODIMENTS

Input circuits according to preferred embodiments of the present invention will hereinafter be described with reference to the accompanying drawings.

Figure 1:
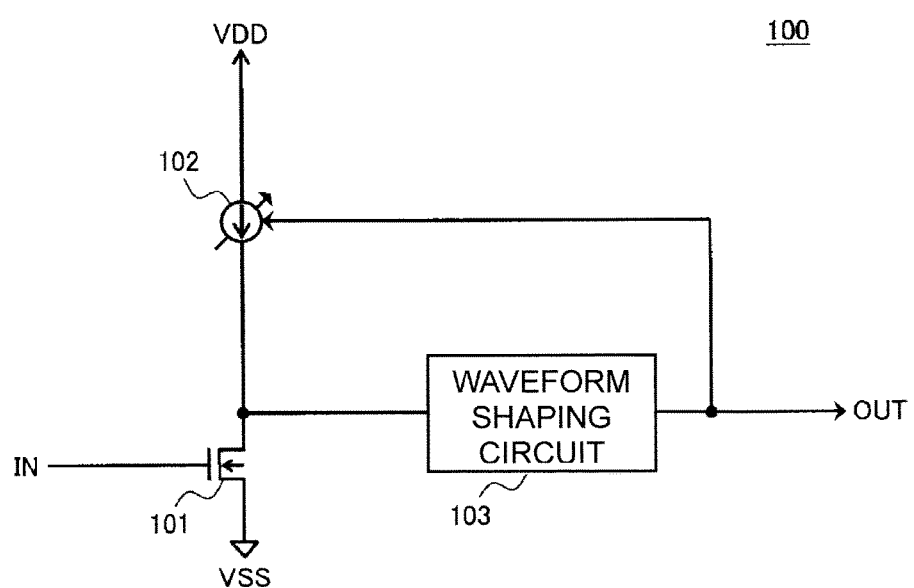
FIG. 1 is a circuit diagram illustrating an input circuit according to a first embodiment of the present invention.

FIG. 1 is a circuit diagram illustrating an input circuit 100 having hysteresis characteristics, according to a first embodiment of the present invention.

The input circuit 100 of the present invention is equipped with an N type input transistor 101 and a current source 102.

The current source 102 and the input transistor 101 are connected in series between a power supply VDD (positive power supply voltage) and a power supply VSS (negative power supply voltage). An input signal IN is inputted to a gate of the input transistor 101, and a signal of a drain (a connection point between the current source 102 and the input transistor 101) of the input transistor 101 is outputted as an output signal OUT of the input circuit 100 through a waveform shaping circuit 103. The output signal OUT is supplied to the current source 102 to control a current value thereof. That is, the current source 102 is configured in such a manner that its current value is changed based on the signal of the connection point between the current source 102 and the input transistor 101. Incidentally, the waveform shaping circuit 103 is a logic circuit which is provided for the purpose of shaping a voltage waveform at the drain of the input transistor 101.

The operation of the input circuit 100 will next be described.

Since the input transistor 101 is turned OFF when the input signal IN is at an L level, the drain of the input transistor 101 becomes an H level. At this time, the current value of the current source 102 is controlled based on the output signal OUT of the waveform shaping circuit 103 so as to be a larger value. Since the threshold of the input circuit 100 at the time that the level of the output signal OUT is transited is determined based on a magnitude relationship between a current driving force of the input transistor 101 and the current value of the current source 102, the threshold of the input circuit 100 in this state indicates a higher value.

When the input signal IN is at an H level, the drain of the input transistor 101 becomes an L level. At this time, the current value of the current source 102 is controlled based on the output signal OUT of the waveform shaping circuit 103 so as to be a smaller value. Since the threshold of the input circuit 100 at the time that the level of the output signal OUT is transited is determined based on the magnitude relationship between the current driving force of the input transistor 101 and the current value of the current source 102, the threshold of the input circuit 100 in this state indicates a lower value.

Thus, with such a configuration that the current value of the current source 102 is changed based on the signal of the connection point between the input transistor 101 and the current source 102, when the input signal IN is at the L level, the threshold of the input circuit 100 at the time that the level of the output signal OUT is transited becomes higher, whereas when the input signal IN is at the H level, the threshold of the input circuit 100 at the time that the level of the output signal OUT is transited becomes lower, thereby resulting in obtaining hysteresis characteristics.

According to the first embodiment of the present invention, since the threshold of the input circuit 100 is determined by the current value of the current source 102, it is not positively affected by the power supply voltage. It is therefore possible to avoid power supply voltage dependency of the threshold of the input circuit 100 at the time that the output signal OUT is transited.

Figure 2:
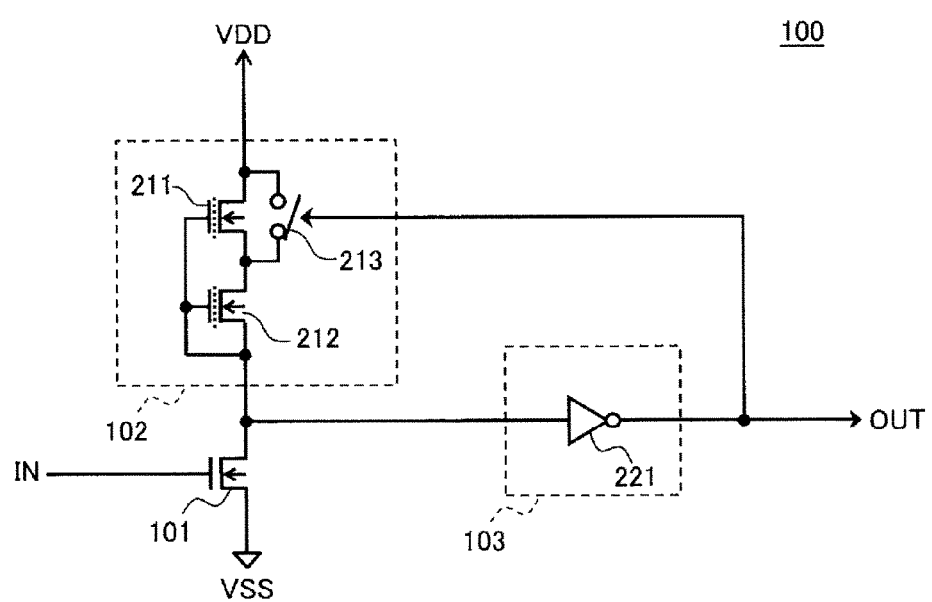
FIG. 2 is a circuit diagram illustrating a specific example of the input circuit according to the first embodiment of the present invention.

FIG. 2 is a circuit diagram illustrating a specific example of the current source 102 and the waveform shaping circuit 103 in the input circuit 100 of FIG. 1.

As illustrated in FIG. 2, the current source 102 is equipped with depletion-type N type transistors 211 and 212 and a switch 213. The waveform shaping circuit 103 is configured by an inverter 221.

The transistors 211 and 212 are respectively connected in series between the power supply VDD and the input transistor 101 and have gates connected in common. The gates thereof are connected to the drain of the input transistor 101. The switch 213 is connected to the transistor 211 in parallel and configured so as to be ON/OFF-controlled by the output signal OUT as the output of the waveform shaping circuit 103, i.e., the output of the inverter 221.

When the switch 213 is in an ON state, the size of the transistor 212 becomes an effective size of the current source 102, and a current that follows it flows. When the switch 213 is in an OFF state, the effective size of the current source 102 is determined based on the sizes of both the transistor 211 and the transistor 212, and a current that follows it flows.

For simplification, assume that in the transistors 211 and 212, for example, their W lengths are equal in terms of the size of W1, and their L lengths are equal in terms of the size of L1. When the switch 213 is in the ON state, the effective size of the current source 102 is given by W1 and L1. When the switch 213 is in the OFF state, the effective size of the current source 102 is given by W1 and L1×2. Hence, it is possible to obtain current values based on them. That is, the switch 213 is operated to perform selective control whether to make only the transistor 212 effective or add the transistor 211 to make the same effective, whereby the current value of the current source 102 is determined. Incidentally, since the current value given by the effective size becomes larger when the switch 213 is in the ON state, hysteresis characteristics are acquired.

Figure 3:
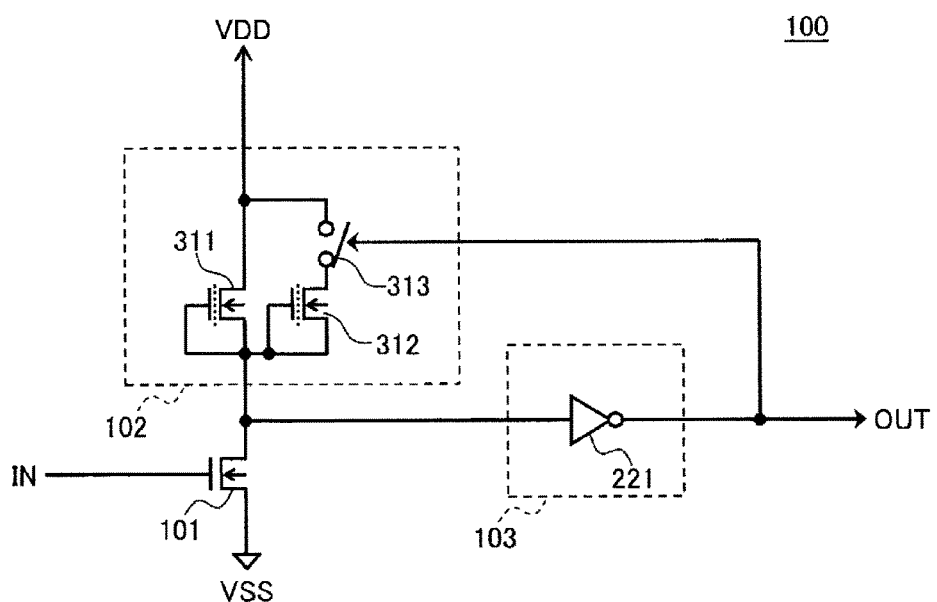
FIG. 3 is a circuit diagram illustrating another specific example of the input circuit according to the first embodiment of the present invention.

FIG. 3 is a circuit diagram illustrating another specific example of the current source 102 in the input circuit 100 of FIG. 1.

The current source 102 illustrated in FIG. 3 is equipped with depletion-type N type transistors 311 and 312 and a switch 313.

The transistor 311 is connected between the power supply VDD and the input transistor 101 and has a gate connected to the drain of the input transistor 101. The transistor 312 is connected to the transistor 311 in parallel. The switch 313 is connected between the power supply VDD and a drain of the transistor 312 and configured so as to be ON/OFF-controlled by the output signal OUT.

When the switch 313 is in an ON state, an effective size of the current source 102 is given based on the sizes of both of the transistors 311 and 312, and a current that follows it flows. When the switch 313 is in an OFF state, the size of the transistor 311 becomes an effective size of the current source 102, and a current that follows it flows.

For simplification, assume that in the transistors 311 and 312, for example, their W lengths are equal in terms of the size of W1, and their L lengths are equal in terms of the size of L1. When the switch 313 is in the ON state, the effective size of the current source 102 is given by W1×2 and L1. When the switch 313 is in the OFF state, the effective size of the current source 102 is given by W1 and L1. Hence, it is possible to obtain current values based on them. The switch 313 is operated to perform selective control whether to make only the transistor 311 effective or add the transistor 312 to make the same effective, whereby the current value of the current source 102 is determined. Incidentally, since the current value given by the effective size becomes larger when the switch 313 is in the ON state, hysteresis characteristics are acquired as with the circuit illustrated in FIG. 2.

Figure 4:
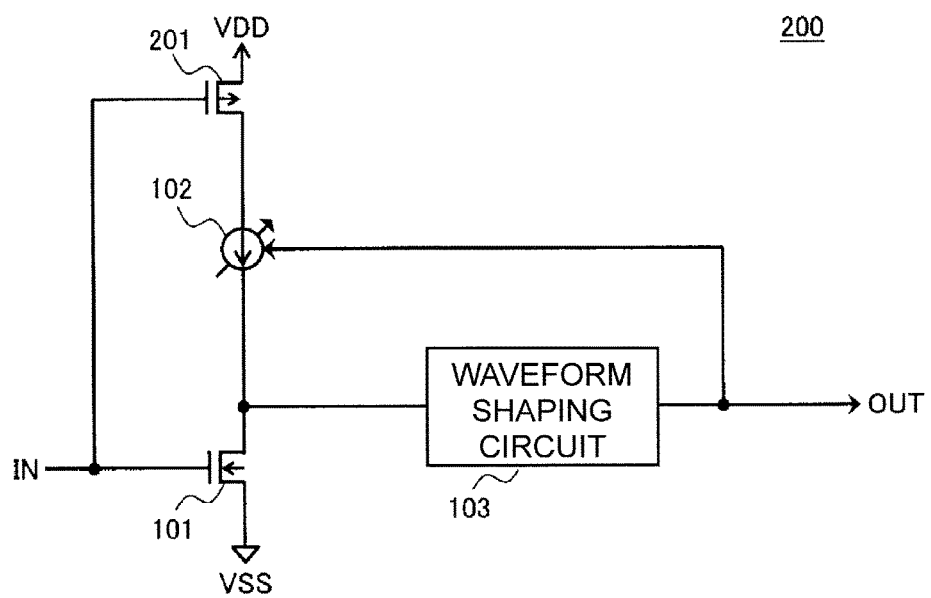
FIG. 4 is a circuit diagram illustrating an input circuit according to a second embodiment of the present invention.
Figure 5:
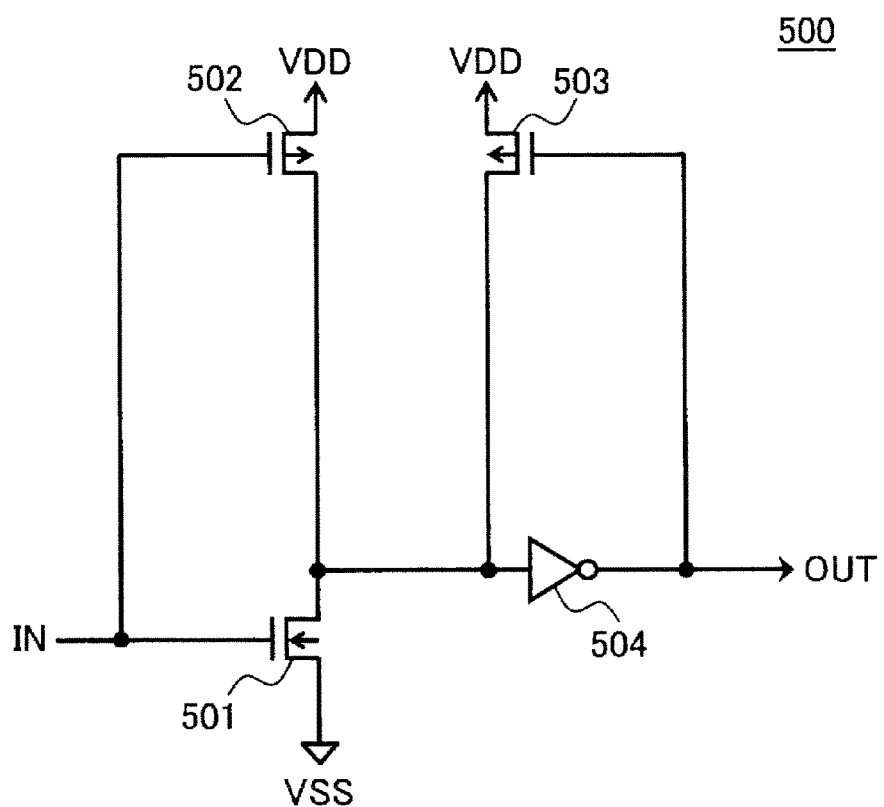
FIG. 5 is a circuit diagram illustrating a related art input circuit.

FIG. 4 is a circuit diagram illustrating an input circuit 200 having hysteresis characteristics, according to a second embodiment of the present invention.

The input circuit 200 is considered in terms of current consumption when an input transistor is in an ON state.

The input circuit 200 is further provided relative to the input circuit 100 illustrated in FIG. 1, with a P type transistor 201 having a gate connected to the gate of the input transistor 101, which is installed between the power supply VDD and the power supply VSS. Since the input circuit 200 is similar to the input circuit 100 illustrated in FIG. 1 in other respects, the same reference numerals are respectively attached to the same components, and their dual description will be omitted as appropriate.

The input circuit 200 is similar in basic operation to the input circuit 100 of FIG. 1, but it is possible to reduce consumption of current in a current path to which the input transistor 101 belongs, because the impedance of the transistor 201 becomes high particularly when an input signal IN is at a high voltage.

As with the input circuit 100 of FIG. 1 even in the input circuit 200, since the threshold of the input signal IN is determined by a current value of a current source 102, it is not positively affected by a power supply voltage. It is therefore possible to avoid power supply voltage dependency of the threshold of the input circuit 200 at the time that an output signal OUT is transited.

In the input circuit 200, the allowable lower limit value of a positive power supply voltage supplied to the power supply VDD serves as a significant point because whether how to acquire a gate-source voltage of each of the transistors 201 and 101 influences an ON or OFF state thereof. In the input circuit 200, however, the voltage across the current source 102 is not held in a series relation with the gate-source voltages of the transistors 201 and 101. Therefore, since the gate-source voltages of the transistors 201 and 101 can effectively be given, the input circuit 200 can normally be operated even if the power supply VDD is at a low voltage.

As described above, according to the input circuit 200 of the second embodiment of the present invention, the input circuit 200 can be operated even based on the low power supply voltage in addition to the ability to avoid the power supply voltage dependency of the threshold as with the input circuit 100 of the first embodiment.

Although the preferred embodiments of the present invention have been described above, the present invention is not limited to the embodiments referred to above. It is needless to say that various changes can be made thereto within the scope not departing from the gist thereof.

For example, in the input circuits according to the embodiments of the present invention, more specifically, the switches 213 and 313 can be configured by transistors, for example, but are not required to be limited to their configurations.

Although in the input circuit 100 (200) according to the embodiment of the present invention, as illustrated in FIGS. 2 and 3, the current source 102 is configured using the two depletion-type transistors and set so as to be changed (controlled) in its effective size, it is apparent that on the basis of a similar way of thinking, the current source 102 is configured using two or more depletion-type transistors and can also be controlled in its effective size.

Although the input transistor 101 has been described as the N type in the input circuit 100 (200) according to the embodiment of the present invention, it is apparent that the power supply voltage dependency of the threshold of the input circuit at the time that the output signal OUT is transited can be avoided based on a complementary way of thinking even if the input transistor 101 is of a P type.

Although in the input circuit 100 (200) according to the embodiment of the present invention, the waveform shaping circuit 103 has been configured as the logic circuit provided for the purpose of shaping the voltage waveform of the drain of the input transistor 101, there is no need to provide the waveform shaping circuit 103 when the shaping of the voltage waveform is not necessary.

In the input circuit 100 (200) according to the embodiment of the present invention, the waveform shaping circuit 103 is not required to be restricted in terms of a specific configuration so far as regards the purpose of shaping the voltage waveform of the drain of the input transistor 101. That is, the waveform shaping circuit 103 is not required to be limited to the inverter 221. It does not matter at all even if, for example, a specific configuration of shaping a waveform by a positive feedback mechanism is taken. It is apparent that since the gain is increased when the waveform shaping circuit 103 shapes the voltage waveform of the drain of the input transistor 101, it is possible to obtain excellent response of the output signal to the input signal.

What is claimed is:

1. An input circuit comprising:
an input transistor and a current source connected in series between a first power supply and a second power supply,
wherein an input signal is input to a gate of the input transistor,
wherein a signal of a connection point between the input transistor and the current source is output as an output signal, and the output signal is connected to a control point of the current source, and
wherein a current value of the current source is changed based on the output signal and a threshold value of the input circuit is determined by the current value of the current source.

2. An input circuit comprising:
an input transistor and a current source connected in series between a first power supply and a second power supply, the current source including a plurality of depletion-type transistors connected in series or parallel and having commonly connected gate electrodes,
wherein an input signal is input to a gate of the input transistor,
wherein a signal of a connection point between the input transistor and the current source is output as an output signal, and the output signal is connected to a control point of the current source, and
wherein a current value of the current source is changed based on the output signal and a threshold value of the input circuit is determined by the current value of the current source.

3. The input circuit according to claim 2, wherein the current source further comprises a switch that activates at least one of the plurality of depletion-type transistors and the current value of the current source is changed according to open or closed state of the switch.

4. The input circuit according to claim 1, further comprising a conductivity type transistor, different from the input transistor, connected between the first power supply and the current source and having a gate connected to the gate of the input transistor.

* * * * *